(12) United States Patent
Burns et al.

(10) Patent No.: US 8,084,185 B2
(45) Date of Patent: Dec. 27, 2011

(54) SUBSTRATE PLANARIZATION WITH IMPRINT MATERIALS AND PROCESSES

(75) Inventors: Sean D. Burns, Hopewell Junction, NY (US); Colin J. Brodsky, Salt Point, NY (US); Ryan L. Burns, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 464 days.

(21) Appl. No.: 12/350,250

(22) Filed: Jan. 8, 2009

(65) Prior Publication Data
US 2010/0173247 A1 Jul. 8, 2010

(51) Int. Cl.
G03F 7/00 (2006.01)
G03F 7/004 (2006.01)
G03F 7/26 (2006.01)
G03F 7/40 (2006.01)

(52) U.S. Cl. .......... 430/270.1; 430/311; 430/281.1; 430/286.1; 430/314; 430/322; 430/317; 430/330; 430/331

(58) Field of Classification Search .......... 430/270.1, 430/311, 281.1, 286.1, 314, 322, 317, 330, 430/331
See application file for complete search history.

(56) References Cited

U.S. PATENT DOCUMENTS

| | | | | |
|---|---|---|---|---|
| 3,463,823 A * | 8/1969 | Vabra et al. | ........... | 568/596 |
| 5,723,617 A * | 3/1998 | Cuny | ........... | 546/94 |
| 6,136,719 A | 10/2000 | Miller et al. | | |
| 6,187,687 B1 * | 2/2001 | Plat et al. | ........... | 438/724 |
| 6,218,316 B1 | 4/2001 | Marsh | | |
| 6,514,667 B2 * | 2/2003 | Angelopoulos et al. | ... | 430/271.1 |
| 6,803,168 B1 | 10/2004 | Padmanaban et al. | | |
| 6,828,227 B2 | 12/2004 | Blalock et al. | | |
| 6,927,015 B2 * | 8/2005 | Khojasteh et al. | ........... | 430/317 |
| 7,030,031 B2 | 4/2006 | Wille et al. | | |
| 7,270,931 B2 * | 9/2007 | Angelopoulos et al. | ... | 430/270.1 |
| 7,307,118 B2 * | 12/2007 | Xu et al. | ........... | 524/463 |
| 7,419,611 B2 * | 9/2008 | DiPietro et al. | ........... | 216/54 |
| 7,455,955 B2 * | 11/2008 | Shih et al. | ........... | 430/311 |
| 7,456,247 B2 * | 11/2008 | Ogura et al. | ........... | 528/205 |
| 2002/0110665 A1 | 8/2002 | Rutter, Jr. et al. | | |
| 2004/0029041 A1 * | 2/2004 | Shih et al. | ........... | 430/271.1 |
| 2006/0138410 A1 | 6/2006 | Lalbahadoersing et al. | | |
| 2007/0009830 A1 | 1/2007 | Huang et al. | | |

(Continued)

FOREIGN PATENT DOCUMENTS

WO   WO 0230859 A2 *  4/2002

OTHER PUBLICATIONS

Titled, "Photolithography Focus Improvement by Reduction of Autofocus Radiation Transmission Into Substrate", filed Feb. 19, 2008 U.S. Appl. No. 12/033,303.

(Continued)

*Primary Examiner* — Amanda C. Walke
(74) *Attorney, Agent, or Firm* — Wenjie Li

(57) ABSTRACT

The present invention relates to planarization materials and methods of using the same for substrate planarization in photolithography. A planarization layer of a planarization composition is formed on a substrate. The planarization composition contains at least one aromatic monomer and at least one non-aromatic monomer. A substantially flat surface is brought into contact with the planarization layer. The planarization layer is cured by exposing to a first radiation or by baking. The substantially flat surface is then removed. A photoresist layer is formed on the planarization layer. The photoresist layer is exposed to a second radiation followed by development to form a relief image in the photoresist layer. The relief image is then transferred into the substrate.

26 Claims, 5 Drawing Sheets

U.S. PATENT DOCUMENTS

2007/0051697 A1* 3/2007 DiPietro et al. ............... 216/52
2007/0298176 A1* 12/2007 DiPietro et al. ............... 427/355
2008/0248331 A1 10/2008 Gallagher et al.
2010/0201043 A1* 8/2010 Houle et al. ............... 264/496
2011/0105507 A1* 5/2011 Ober et al. ............... 514/239.2

OTHER PUBLICATIONS

International Application No. PCT/US10/20120—Filed Jan. 5, 2010 International Search Report and Written Opinion of the International Searching Authority—Dated Mar. 1, 2010.

* cited by examiner

SUBSTRATE PLANARIZATION WITH IMPRINT MATERIALS AND PROCESSES

FIELD OF THE INVENTION

This invention generally relates to materials and methods for semiconductor fabrication. More particularly, this invention is directed to planarization materials and methods of using the same for substrate planarization in photolithography.

BACKGROUND OF THE INVENTION

Miniaturized electronic components such as integrated circuits are typically manufactured using photolithography technology. In a photolithography process, a photoresist layer is deposited on a substrate, such as a silicon wafer. The substrate is baked to remove any solvent remained in the photoresist layer. The photoresist is then exposed through a photomask with a desired pattern to a source of actinic radiation. The radiation exposure causes a chemical reaction in the exposed areas of the photoresist and creates a latent image corresponding to the mask pattern in the photoresist layer. The photoresist is next developed in a developer solution to remove either the exposed portions of the photoresist for a positive photoresist or the unexposed portions of the photoresist for a negative photoresist. The patterned photoresist can then be used as a mask for subsequent fabrication processes on the substrate, such as deposition, etching, or ion implantation processes.

A major consideration in a photolithographic process is the depth of focus (DOF). DOF is a measurement of how much distance exists behind the lens of the exposure tool wherein the film plane still remains in focus. DOF is governed by the equation $$DOF = \kappa_2 \lambda / NA^2$$

where $\kappa_2$ is a constant for a specific lithographic process, $\lambda$ is the wavelength of the radiation used in the exposure, NA is the numerical aperture of the lens of the exposure tool. To improve the resolution of a photolithographic process, the semiconductor industry has continually moved to higher-NA exposure tools. However, the use of higher-NA tools tends to drastically decrease DOF, as indicated in the above equation.

In order to produce a lithographic pattern with high resolution, the exposure light must be focused throughout the photoresist film thickness and across the entire semiconductor wafer substrate. This requires that photoresist film thickness and the substrate topography are less than the DOF. However, for many semiconductor levels, especially the back-end-of-the-line (BEOL) levels, the substrate topography during exposure is often as large as, or even larger than, the available DOF. This would lead to greatly degraded lithographic results. The situation is further aggravated when a high-NA exposure tool is used, since the available DOF is small to begin with.

To alleviate the effects of substrate topography, various techniques have been used to planarize the surface of the substrate on which the photoresist is deposited. For example, underlayers or bottom anti-reflective coating (BARCs) have been spin-coated onto the substrate to planarize the substrate surface. However, spin-coated underlayers or BARCs only have short range (less than 2 μm) planarization effect. On the other hand, state of the art exposure systems are capable of compensating for topography, but only over a relatively long range (millimeters). Thus, there is a medium range of distances (from about 2 μm to about 500 μm) which are not planarized easily be spin coating techniques, and which are not compensated for by the exposure systems.

Another commonly used planarization technique is chemical-mechanical polishing (CMP). However, CMP is only capable of reducing substrate topography down to 100-200 nm ranges and performance can vary greatly from one circuit design to the next. Achieving predictable CMP performance can impose new constraints on design layouts and density.

Accordingly, it is desirable to provide a method which can planarize the substrate surface over a medium range of distances and which is suited for high-NA imaging processes.

SUMMARY OF THE INVENTION

In one aspect, the present invention relates to a photolithography method involving the steps of forming a planarization layer of a planarization composition on a substrate, wherein the planarization composition comprises at least one aromatic monomer and at least one non-aromatic monomer; bringing a substantially flat surface into contact with the planarization layer on the substrate; curing the planarization layer by exposing the planarization layer to a first radiation or by baking the planarization layer; removing the substantially flat surface; forming a photoresist layer on the planarization layer; exposing the photoresist layer to a second radiation having an imaging wavelength; developing the photoresist layer to form a relief image in the photoresist layer; and transferring the relief image into the substrate.

Preferably, when the planarization composition contains silicon, the photoresist is a non-silicon containing resist. On the other hand, when the planarization composition is a non-silicon containing composition, the photoresist is preferably a silicon containing resist.

In another aspect, the present invention relates to a photolithography method involving the steps of forming a planarization layer of a planarization composition on a substrate; bringing a substantially flat surface into contact with the planarization layer on the substrate; curing the planarization layer by exposing the planarization layer to a first radiation or by baking the planarization layer; removing the substantially flat surface; forming a silicon anti-reflective coating (Si-ARC) layer on the planarization layer; forming a photoresist layer on the Si-ARC layer; exposing the photoresist layer to a second radiation having an imaging wavelength; developing the photoresist layer to form a relief image in the photoresist layer; and transferring the relief image into the substrate.

In still another aspect, the present invention relates to a photolithography method involving the steps of forming a planarization layer of a planarization composition on a substrate; bringing a substantially flat surface into contact with the planarization layer on the substrate; curing the planarization layer by exposing the planarization layer to a first radiation or by baking the planarization layer; removing the substantially flat surface; forming a hardmask layer on the planarization layer; forming a photoresist layer on the hardmask layer; exposing the photoresist layer to a second radiation having an imaging wavelength; developing the photoresist layer to form a relief image in the photoresist layer; and transferring the relief image into the substrate. The hardmask layer is preferably LTO. The photolithographic method may further contain a step of forming an anti-reflective coating (ARC) layer on the hardmask layer, after forming the hardmask layer and before forming the photoresist layer.

It is possible that the planarization layer could cover two or more dies on the substrate in the above photolithography methods. The imaging wavelength of the second radiation is preferably about 193 nm.

In still another aspect, the present invention relates to a planarization composition having at least one aromatic monomer and at least one non-aromatic monomer.

It is preferred that the planarization composition has a refractive index (n) in the range from about 1.4 to about 1.8 and an absorption parameter (k) in the range from about 0.2 to about 0.5 at about 193 nm.

The at least one aromatic monomer is preferably at a concentration ranging from about 5% to about 35% of the total weight of the planarization composition. The at least one non-aromatic monomer is preferably at a concentration ranging from about 65% to about 95% of the total weight of the planarization composition.

It is preferred that the at least one aromatic monomer is selected from the group consisting of

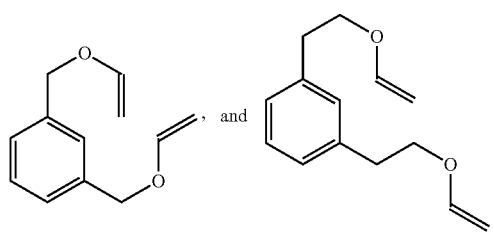

(II)

It is also preferred that the at least one non-aromatic monomer is selected from the group consisting of i.

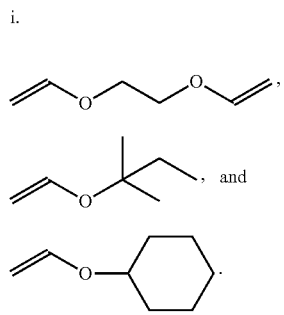

(III)

(IV)

, and (V)

The planarization composition may further comprise at least one of a photoacid generator, a sensitizing agent, a surfactant, an adhesion agent and a base quencher.

The planarization composition may also comprise a dye which renders the planarization composition a first absorption peak in a wavelength range from about 900 nm to about 1200 nm and a second absorption peak in a wavelength range from about 100 nm to about 300 nm. It is preferred that the first absorption peak has an absorption parameter (k) greater than about 0.5 and the second absorption peak has an absorption parameter (k) from about 0.1 to about 0.7. It is also preferred that the planarization composition has an absorption parameter (k) less than 0.1 at a wavelength ranging from about 500 nm to about 600 nm.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF PREFERRED EMBODIMENTS

Figure 1:
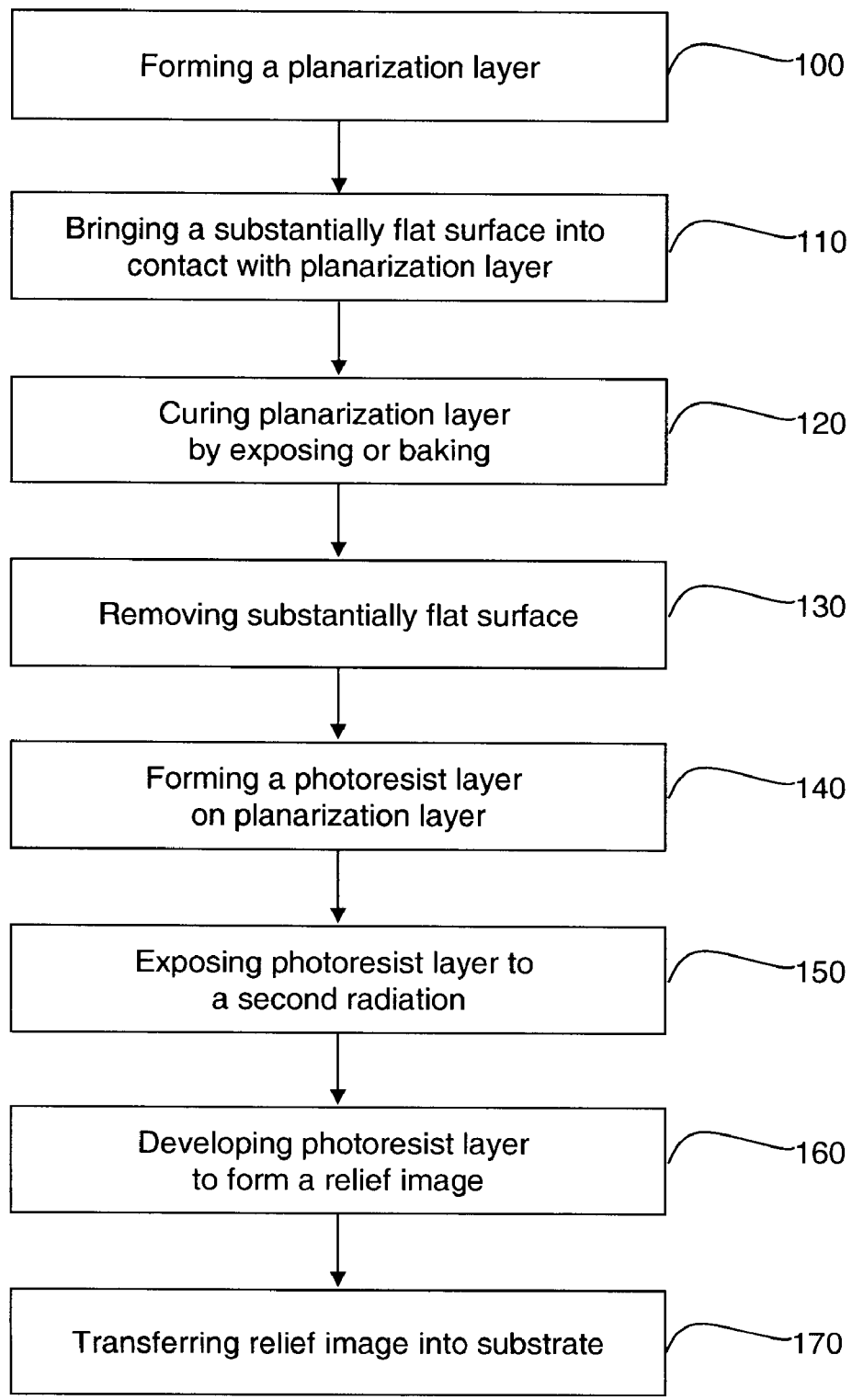
FIG. 1 is a flow chart illustrating a photolithography method, in accordance with embodiments of the present invention.

In describing the preferred embodiments of the present invention, reference will be made herein to FIGS. 1-9 of the drawings in which like numerals refer to like features of the invention. Features of the invention are not necessarily shown to scale in the drawings.

It will be understood that when an element, such as a layer, is referred to as being "on" or "over" another element, it can be directly on the other element or intervening elements may also be present. In contrast, when an element is referred to as being "directly on" or "directly over" another element, there are no intervening elements present.

The present invention provides a photolithography method utilizing imprint materials and processes to planarize a substrate. Unlike spin-coated underlayers or BARCs, imprint materials and processes offer long range planarization (>1 µm). Imprint material is typically a monomer or a polymer formulation that is cured by heat or UV light during the imprinting process. In various embodiments of the present invention, the optical properties of the planarization materials are optimized so that the planarization layer can also act as a BARC or underlayer for an overlying photoresist. In addition, the schemes of the photolithography method are designed to include bilayer and trilayer resist schemes in order to achieve better lithographic results.

FIG. 1 is a flow chart illustrating a photolithography method. Step 100 comprises forming a planarization layer of a planarization composition on a substrate. The substrate in the present invention is suitably any substrate conventionally used in processes involving photoresists. For example, the substrate can be silicon, silicon oxide, aluminum-aluminum oxide, gallium arsenide, ceramic, quartz, copper or any combination thereof, including multilayers. The substrate can include one or more semiconductor layers or structures and can include active or operable portions of semiconductor devices.

The planarization composition is an imprint material comprising a polymerizable or crosslinkable monomer or polymer. The planarization composition preferably has a refractive index (n) in the range from about 1.4 to about 1.8 at the imaging wavelength of the radiation for the overlying photoresist. The imaginary component of the index of refraction (k) (also referred to herein as the absorption parameter) of the planarization composition is preferably in the range from about 0.2 to about 0.5 at the imaging wavelength of the radiation for the overlying photoresist. The absorption parameter (k) indicates the amount of absorption loss when an electromagnetic wave propagates through a material. The imaging wavelength of the radiation for the overlying photoresist is preferably about 365 nm, 248 nm, 193 nm or 13.5 nm, more preferably about 193 nm.

Preferably, the planarization material in the present invention comprises at least one aromatic monomer and at least one non-aromatic monomer. More preferably, the at least one aromatic monomer is at a concentration ranging from about 5% to about 35% of the total weight of the planarization composition. The at least one non-aromatic monomer is at a concentration ranging from about 65% to about 95% of the total weight of the planarization composition.

Examples of the aromatic monomer in the planarization composition include, but are not limited to:

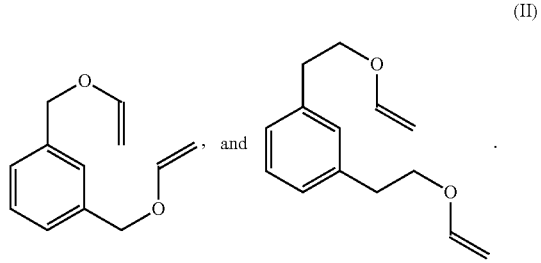

(II)

Examples of the non-aromatic monomer in the planarization composition include, but are not limited to:

i.

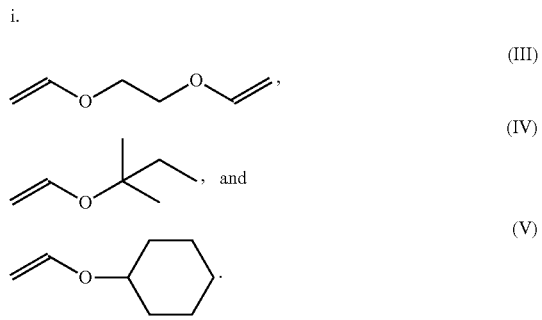

(III)

(IV)

, and (V)

In addition to the polymerizable or crosslinkable monomers or polymers, the planarization composition may further comprise at least one of a photoacid generator (PAG), a sensitizing agent, a surfactant, an adhesion agent and a base quencher. The PAG described herein is capable of generating acid upon exposure to a radiation, such as visible, ultraviolet (UV), extreme ultraviolet (EUV) light. The PAG may comprise, for example, sulfonium salts, iodonium salts, sulfonic acid esters of N-hydroxyamides, imides, or combinations thereof. In one exemplary embodiment of the present invention, the PAG comprises at least one of 4-(1-butoxynaphthyl) tetrahydrothiophenium perfluorobutanesulfonate, triphenyl sulfonium perfluorobutanesulfonate, t-butylphenyl diphenyl sulfonium perfluorobutanesulfonate, 4-(1-butoxynaphthyl) tetrahydrothiophenium perfluorooctanesulfonate, triphenyl sulfonium perfluorooctanesulfonate, t-butylphenyl diphenyl sulfonium perfluorooctanesulfonate, di(t-butylphenyl)iodonium perfluorobutane sulfonate, di(t-butylphenyl)iodonium perfluorohexane sulfonate, di(t-butylphenyl)iodonium perfluoroethylcyclohexane sulfonate, di(t-buylphenyl)iodonium camphoresulfonate, and perfluorobutylsulfonyloxybicylo [2.2.1]-hept-5-ene-2,3-dicarboximide.

Examples of the suitable sensitizing agent in the present invention include, but are not limited to: 9-anthracene-methanol, substituted 9-antracene methanol, phenothiazine, and substituted phenothiazine.

The surfactant in the present invention may comprise at least one of a fluorine-containing surfactant and a siloxane-containing surfactant. For example, fluorinated vinyl ethers may be used as a surfactant. An example of a fluorinated vinyl ether is vinyl 2,2,2-trifluoroethyl ether. The surfactant may also act as a releasing agent in the present invention.

Suitable adhesion agents for the present invention include, but are not limited to: hexamethyldisilazane (HMDS), ethylorthosilicate, tetraalkyloxysilane, aminoethylaminopropyltrialkoxysilane, aminopropyltrialkoxysilane, aminoethyltrialkoxysilane, tetraalkoxytitanate, combinations thereof, as well as other examples known to those in the art. The adhesion agent may be a part of the planarization composition. Alternatively, the adhesion agent may be applied to the substrate separately prior to the deposition of the planarization composition.

Preferably, the planarization composition also contains a base quencher. The base quencher may comprise, for example, aliphatic amines, aromatic amines, carboxylates, hydroxides, or combinations thereof.

The planarization composition may also comprise a dye which provides the planarization composition with desired optical properties for improved focal plane measurement and defectivity scan. Preferably, the planarization composition has a first absorption peak in a wavelength range from about 900 nm to about 1200 nm and a second absorption peak in a wavelength range from about 100 nm to about 300 nm. More preferably, the first absorption peak has an absorption parameter (k) greater than about 0.5 and the second absorption peak has an absorption parameter (k) from about 0.1 to about 0.7. It is also preferred that the planarization composition has an absorption parameter (k) less than 0.1 at a wavelength ranging from about 500 nm to about 600 nm.

One example of suitable dyes that may be used within the context of the present invention is a commercially available dye from H. W. Sands Corporation, Jupiter, Fla. 33477, as product number SDA4137. Additional examples of dyes suitable to be used within the context of the present invention include isoquinoline dyes taught by Cuny, in U.S. Pat. No. 5,723,617.

The planarization composition is not limited to any specific proportions of the various components. The planarization composition preferably comprises about 50% by weight (wt %) to about 98 wt % of the monomers based on the total weight of the planarization composition, more preferably from about 85 wt % to about 95 wt %. The planarization composition preferably comprises from about 0.5 wt % to about 10 wt % PAG based on the total weight of the monomers in the composition, more preferably from about 1 wt % to about 5 wt %. The planarization composition preferably comprises from about 0.01 wt % to about 1 wt. % of sensitizer based on the total weight of the monomers, more preferably from about 0.1 wt % to about 0.3 wt %. The planarization composition preferably comprises from about 0.01 wt % to about 0.05 wt. % of surfactant based on the total weight of the monomers, more preferably from about 0.01 wt % to about 0.03 wt %. The planarization composition preferably comprises from about 0.01 wt % to about 0.05 wt. % of adhesion agent based on the total weight of the monomers, more preferably from about 0.01 wt % to about 0.03 wt %. The planarization composition preferably includes from about 0.1 wt % to about 2.0 wt % of base quencher based on the total weight of the monomers in the composition, more preferably from about 0.2 wt % to about 1.0 wt %.

Step 110 comprises bringing a substantially flat surface into contact with the planarization layer on the substrate. The substantially flat surface may be the lower surface of a flat template. The flat template is preferably transparent to the wavelength of radiation that the planarization composition is sensitive to. Pressure may be used to press the flat template toward the substrate so that the planarization layer completely fills trenches (or grooves) in the substrate and the flatness of the substantially flat surface is transferred to the planarization layer.

In Step 120, the planarization layer is cured by exposing the planarization layer to a first radiation or by baking the planarization layer. During this step, the PAG contained in the planarization composition generates acid when irradiated or heated. The acid then catalyzes polymerization of the monomer or crosslinking of the polymer contained in the planarization composition. The polymerization or crosslinking solidifies the planarization layer. The first radiation employed in the present invention can be visible or ultraviolet (UV) light. The wavelength of the first radiation is preferably in the range from about 200 nm to about 450 nm. The preferred range of the bake temperature is from about room temperature to about 200° C., more preferably from about 150° C. to about 180° C.

Step 130 comprises removing the substantially flat surface from the cured planarization layer.

In Step 140, a photoresist layer is formed on the cured planarization layer. The photoresist may be any photoresist conventionally used in semiconductor industry, including 193 nm and 248 nm photoresists. Both positive-tone resists and negative-tone resists are suitable to be used in the present invention. The photoresist layer may be formed by virtually any standard means including spin coating. The photoresist layer may be baked (post applying bake (PAB)) to remove any solvent from the photoresist and improve the coherence of the photoresist layer. The preferred range of the PAB temperature for the photoresist layer is from about 70° C. to about 150° C., more preferably from about 90° C. to about 130° C. The preferred range of thickness of the first layer is from about 20 nm to about 400 nm, more preferably from about 50 nm to about 300 nm.

The photoresist can be either a non-silicon containing resist or a silicon containing resist. When the photoresist is a non-silicon containing resist, it is preferred that the planarization composition contains silicon. On the other hand, when the photoresist is a silicon containing resist, such as a bilayer resist commonly used in the semiconductor industry, it is preferred that the planarization composition is a non-silicon containing composition.

Step 150 comprises exposing the photoresist layer to a second radiation having an imaging wavelength. The second radiation employed in the present invention can be visible light, ultraviolet (UV), extreme ultraviolet (EUV) and electron beam (E-beam). It is preferred that the imaging wavelength of the second radiation is about 365 nm, 248 nm, 193 nm or 13 nm. It is more preferred that the imaging wavelength of the second radiation is about 193 nm.

In Step 160, the photoresist layer is developed in an aqueous base solution to form a relief image in the photoresist layer. It is preferred that the aqueous base solution is tetramethylammonium hydroxide (TMAH) solutions. It is further preferred that the concentration of the TMAH solutions is about 0.263 N. The aqueous base solution may further comprise additives, such as surfactants, polymers, isopropanol, ethanol, etc.

A post exposure bake (PEB) step may be performed after the photoresist layer is exposed with the second radiation and before it is developed. The preferred range of the PEB temperature is from about 70° C. to about 120° C., more preferably from about 90° C. to about 110° C. In some instances, it is possible to avoid the PEB step since for certain chemistries, such as acetal and ketal chemistries, deprotection of the resist polymer proceeds at room temperature.

Step 170 comprises transferring the relief image into the substrate by removing portions of the substrate not covered by the patterned photoresist layer. Typically, portions of the substrate are removed by reactive ion etching or some other technique known to one skilled in the art. The method of the invention may be used to create patterned structures such as metal wiring lines, holes for contacts or vias, insulation sections (e.g., damascene trenches or shallow trench isolation), trenches for capacitor structures, etc. as might be used in the design of integrated circuit devices.

Figure 2:
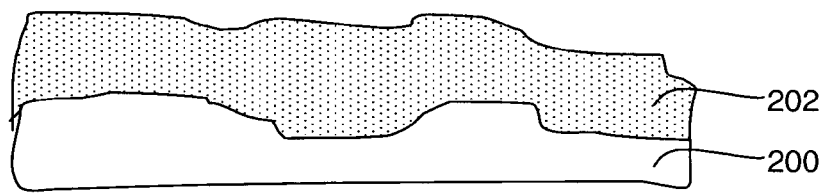
FIGS. 2-9 are cross-sectional views that illustrate exemplary processing steps of a photolithography method, in accordance with embodiments of the present invention.

FIGS. 2-9 are cross-sectional views illustrating exemplary processing step in accordance with embodiments of the present invention. In FIG. 2, a planarization composition is applied to a substrate 200 to form a planarization layer 202, such as described in Step 100 above. The planarization composition preferably has a refractive index (n) in the range from about 1.6 to about 1.8 and an absorption parameter (k) in the range from about 0.2 to about 0.5 at the imaging wavelength of the radiation for the overlying photoresist.

Figure 3:
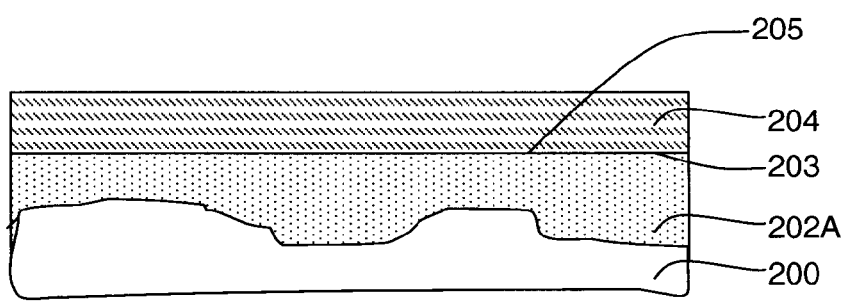

FIG. 3 is an illustration of the substrate 200 after a substantially flat surface 205 of a flat template 204 is brought into contact with the planarization layer 202, such as described in Step 110 above. The flat template 204 may be pressed toward the substrate by pressure so that the planarization layer 202A completely fills trenches (or grooves) in the substrate 200. The flatness of the substantially flat surface 205 is transferred to the planarization layer 202A. As shown in FIG. 3, the planarization layer 202A has a flat surface 203.

Figure 4:
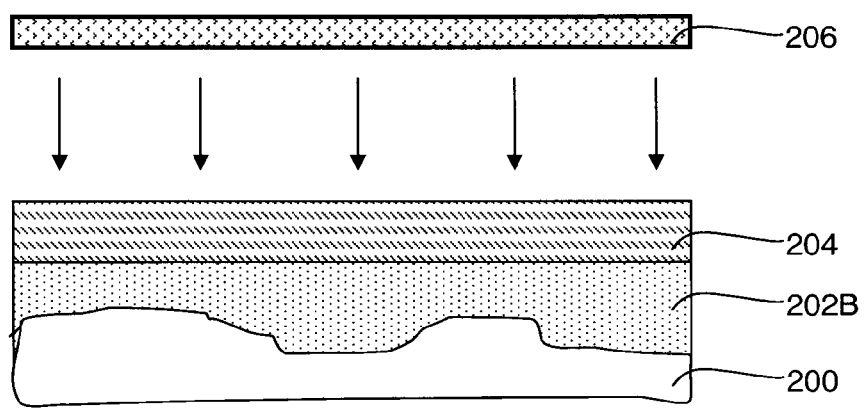

FIG. 4 illustrates the step of exposing the planarization layer 202A to a first radiation 206, such as described in Step 120 above. The first radiation 206 can be visible or UV light. Since the flat template 204 is transparent to the first radiation 206, most light of the first radiation 206 can reach the planarization layer 202A. A polymerization or crosslinking reaction is initiated which cures the planarization layer 202A. The cured planarization layer is depicted as 202B in FIG. 4.

Figure 5:
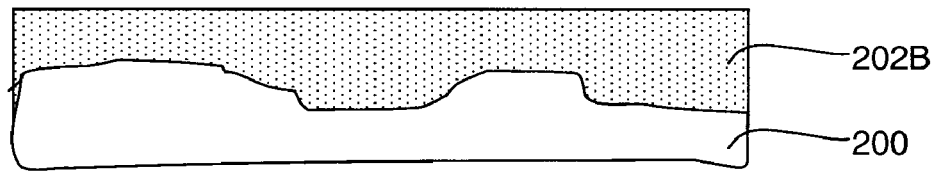

FIG. 5 illustrates the substrate 200 with the cured planarization layer 202B after the substantially flat surface 205 is removed, such as described in Step 130 above.

Figure 6A:
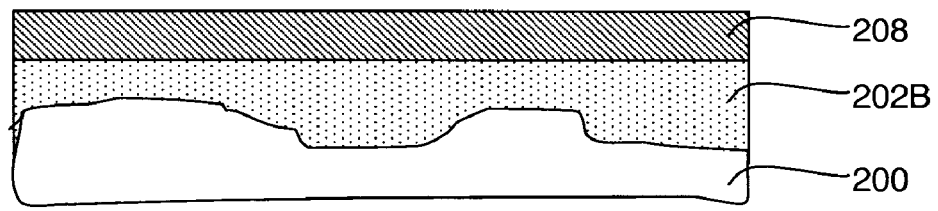

In FIG. 6a, a photoresist layer 208 is formed on the cured planarization layer 202B, such as described in Step 140 above. The photoresist layer is preferably formed by spin-coating. A PAB step may be performed to remove any remaining solvent in the photoresist layer 208 after layer 208 is formed.

In one embodiment of the present invention, the photoresist layer 208 is formed directly on the cured planarization layer 202B.

Figure 6B:
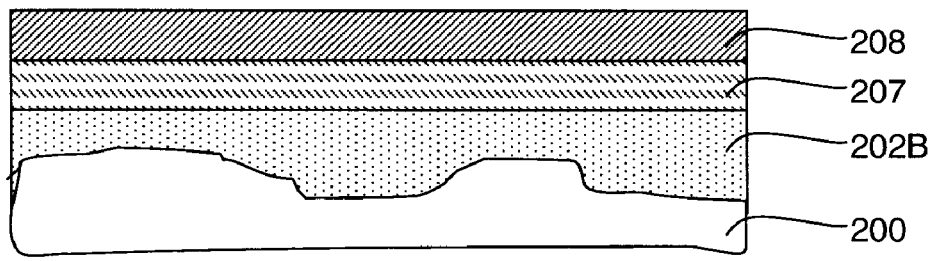

In another embodiment of the present invention, a silicon anti-reflective coating (Si-ARC) layer 207 is first formed on the cured planarization layer 202B after the substantially flat 205 is removed. The photoresist layer 208 is then formed over the Si-ARC layer 207, as illustrated in FIG. 6b. Examples of commercially available Si-ARC formulations suitable for forming the Si-ARC layer 207 include, but are not limited to, Shin Etsu SHBA940, SHBA629, AZ S2H4, and any other commercially available silicon ARCs (or spin on hard mask) known to those familiar with the art. The Si-ARC layer 207 may be formed by virtually any standard means including spin coating. Optionally, the substrate 200 is baked after the Si-ARC layer 207 is formed. The bake process can remove any solvent from the Si-ARC layer 207 and improve the coherence and uniformity of the Si-ARC layer. The bake process may also initiate a crosslinking reaction which renders the Si-ARC layer insoluble in the solvent for the photoresist layer 208. The preferred range of the bake temperature is from about 160° C. to about 250° C., more preferably from about 180° C. to about 210° C.

Figure 6C:
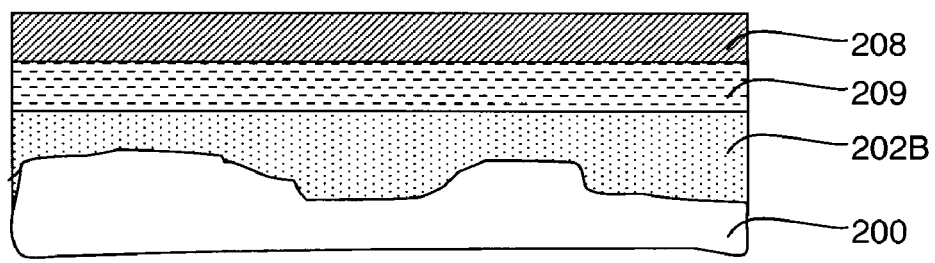

In still another embodiment of the present invention, a hardmask layer 209 is first formed on the cured planarization layer 202B after the substantially flat 205 is removed. The photoresist layer 208 is then formed over the hardmask layer 209, as illustrated in FIG. 6c. The hardmask layer 209 may comprise any suitable hardmask material, such as an oxide, nitride, or oxynitride, and it can be deposited by well known techniques such as chemical vapor deposition (CVD), plasma-assisted CVD, atomic layer deposition (ALD), evaporation, reactive sputtering, chemical solution deposition and other like deposition processes. Preferably, the hardmask layer 209 comprises a low temperature oxide (LTO) and is deposited by a CVD process.

Figure 6D:
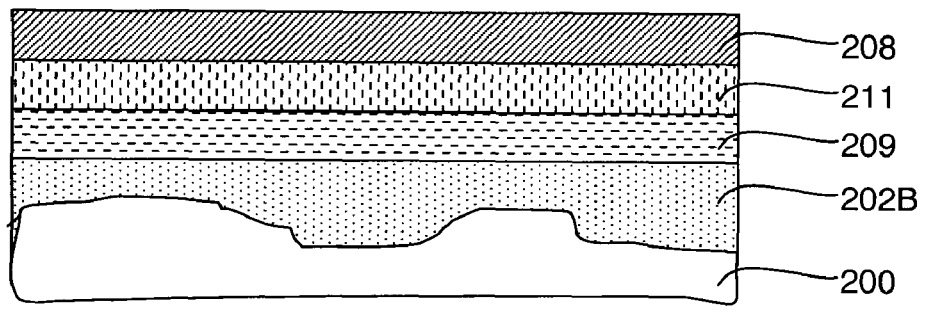

Optionally, but not necessarily, an anti-reflective coating (ARC) layer 211 may be formed over the hardmask layer 209 before the photoresist layer 208 is formed, as shown in FIG. 6d. The ARC layer comprises ARC materials commonly used in conjunction with photoresists. The ARC layer may be baked to remove any solvent and improve the coherence of the ARC layer. The bake process may also initiate a crosslinking reaction which renders the ARC layer insoluble in the solvent for the photoresist layer 208. The preferred range of the bake temperature is from about 160° C. to about 250° C., more preferably from about 200° C. to about 220° C.

Figure 7:
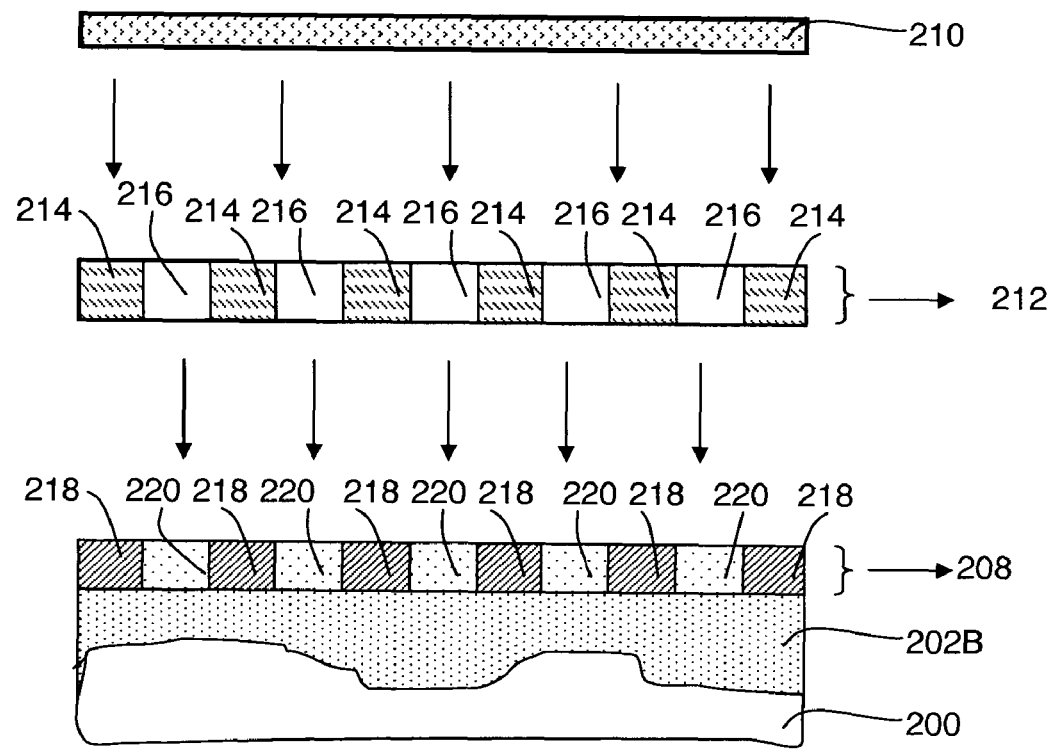

In FIG. 7, the photoresist layer 208 is exposed to a second radiation 210 through a patterned mask 212, such as described in Step 150 above. The patterned mask 212 comprises a pattern in which masked sections 214 are essentially opaque to the radiation or impenetrable to the energetic particles, and unmasked sections 216 are essentially transparent to the radiation or penetrable to the energetic particles. Radiation or particles passing through the unmasked sections 216 may be transmitted to the photoresist layer 208 to be absorbed in the exposed regions 220, wherein the radiation or particles may induce the production of an acid in the exposed regions 220 of the photoresist layer 208. Unexposed regions 218 of the photoresist layer 208 may not produce an acid. Exposure to the radiation or energetic particles may render the exposed regions 220 soluble in a base developer.

The patterned mask 212 employed in the present invention can be any photomask commonly used in photolithographic processes including attenuated PSMs. The pattern feature on the patterned mask 212 may include, but is not limited to, lines, trenches and contact holes.

Figure 8:
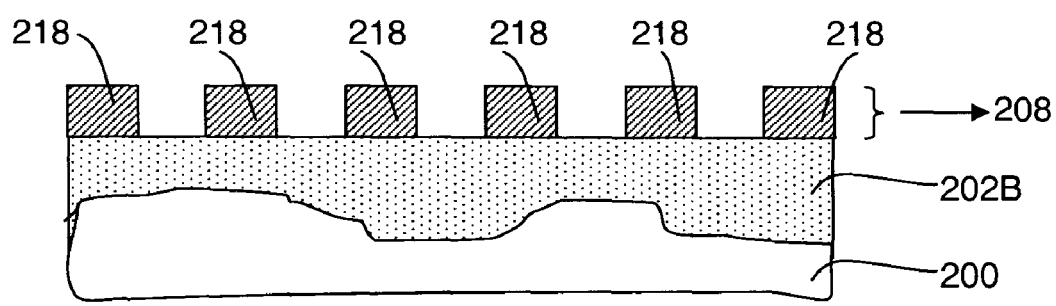

FIG. 8 is an illustration of the substrate 200 and the layers of FIG. 7 after developing the photoresist layer 208 in an aqueous base solution, such as described in Step 160 above. A relief image 218 is formed in the photoresist layer 208 after base solution regions 220 are removed. The relief image 218 comprises the pattern contained in the patterned mask 212.

A PEB step may be performed after the photoresist layer 208 is exposed and before it is developed. When the photoresist is a positive-tone resist, the PEB step may induce a deprotection chemistry in the exposed regions of the photoresist layer, rendering the exposed regions soluble in a base developer. When the photoresist is a negative-tone resist, the PEB step may induce a crosslinking chemistry in the exposed regions of the photoresist layer and render the exposed regions insoluble in a base developer. The preferred range of the PEB temperature is from about 70° C. to about 140° C., more preferably from about 90° C. to about 130° C.

Figure 9:

FIG. 9 is an illustration of the substrate 200 after the relief image 218 is transferred to the substrate, such as described in Step 170 above. The relief image 218 is transferred to the substrate 200 by removing portions of the substrate 200 not covered by the patterned photoresist layer 208. Typically, portions of the substrate are removed by reactive ion etching or some other technique known to one skilled in the art. It is possible that part of the photoresist layer 208 and the cured planarization layer 202B may remain after the transferring step. In that case, a stripping step is performed after the transferring step to strip any remaining photoresist layer 208 and cured planarization layer 202B from the substrate 200.

While the present invention has been particularly shown and described with respect to preferred embodiments, it will be understood by those skilled in the art that the foregoing and other changes in forms and details may be made without departing from the spirit and scope of the invention. It is therefore intended that the present invention not be limited to the exact forms and details described and illustrated but fall within the scope of the appended claims.

What is claimed is:

1. A photolithography method comprising:
forming a planarization layer of a planarization composition on a substrate, wherein said planarization composition comprises at least one aromatic monomer and at least one non-aromatic monomer and said at least one aromatic monomer has a weight concentration ranging from about 5% to about 35% of the total weight of said planarization composition;
bringing a substantially flat surface into contact with said planarization layer on said substrate;
curing said planarization layer by exposing said planarization layer to a first radiation or by baking said planarization layer;
removing said substantially flat surface;
forming a photoresist layer on said planarization layer;
exposing said photoresist layer to a second radiation having an imaging wavelength;
developing said photoresist layer to form a relief image in said photoresist layer; and
transferring said relief image into said substrate.

2. The method of claim 1, wherein said imaging wavelength of said second radiation is about 193 nm.

3. The method of claim 1, wherein said planarization composition has a refractive index (n) in the range from about 1.4 to about 1.8 and an absorption parameter (k) in the range from about 0.2 to about 0.5 at said imaging wavelength of said second radiation.

4. A photolithography method comprising:
forming a planarization layer of a planarization composition on a substrate, wherein said planarization composition comprises at least one aromatic monomer and at least one non-aromatic monomer and said at least one non-aromatic monomer has a weight concentration ranging from about 65% to about 95% of the total weight of said planarization compositional;
bringing a substantially flat surface into contact with said planarization layer on said substrate;
curing said planarization layer by exposing said planarization layer to a first radiation or by baking said planarization layer;
removing said substantially flat surface;
forming a photoresist layer on said planarization layer;
exposing said photoresist layer to a second radiation having an imaging wavelength;
developing said photoresist layer to form a relief image in said photoresist layer; and
transferring said relief image into said substrate.

5. The method of claim 1, wherein said at least one aromatic monomer is selected from the group consisting of

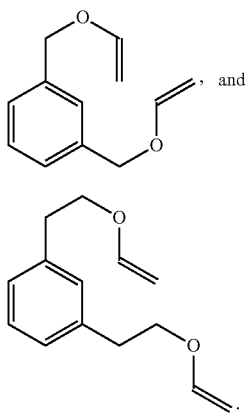

6. A photolithography method comprising:
forming a planarization layer of a planarization composition on a substrate, wherein said planarization composition comprises at least one aromatic monomer and at least one non-aromatic monomer and said at least one non-aromatic monomer is selected from the group consisting of

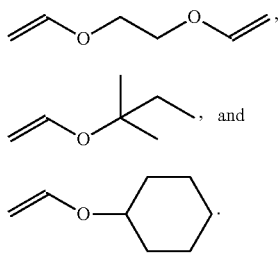

bringing a substantially flat surface into contact with said planarization layer on said substrate;
curing said planarization layer by exposing said planarization layer to a first radiation or by baking said planarization layer;
removing said substantially flat surface;
forming a photoresist layer on said planarization layer;
exposing said photoresist layer to a second radiation having an imaging wavelength;
developing said photoresist layer to form a relief image in said photoresist layer; and
transferring said relief image into said substrate.

7. The method of claim 1, wherein said planarization composition further comprises at least one of a photoacid generator, a sensitizing agent, a surfactant, an adhesion agent and a base quencher.

8. The method of claim 1, wherein said planarization composition comprises a dye which renders said planarization composition having a first absorption peak in a wavelength range from about 900 nm to about 1200 nm and a second absorption peak in a wavelength range from about 100 nm to 300 nm.

9. The method of claim 8, wherein said first absorption peak has an absorption parameter (k) greater than about 0.5 and said second absorption peak has an absorption parameter (k) from about 0.1 to about 0.7.

10. The method of claim 8, wherein said planarization composition has an absorption parameter (k) less than 0.1 at a wavelength ranging from about 500 nm to about 600 nm.

11. The method of claim 1, wherein said planarization layer covers two or more dies on said substrate.

12. A photolithography method comprising:
forming a planarization layer of a planarization composition on a substrate, wherein said planarization composition comprises at least one aromatic monomer and at least one non-aromatic monomer;
bringing a substantially flat surface into contact with said planarization layer on said substrate;
curing said planarization layer by exposing said planarization layer to a first radiation or by baking said planarization layer;
removing said substantially flat surface;
forming a photoresist layer on said planarization layer;
exposing said photoresist layer to a second radiation having an imaging wavelength;
developing said photoresist layer to form a relief image in said photoresist layer; and
transferring said relief image into said substrate, wherein said planarization composition contains silicon and said photoresist is a non-silicon containing resist.

13. The method of claim 1, wherein said planarization composition is a non-silicon containing composition and said photoresist is a silicon containing resist.

14. The method of claim 1, further comprising:
after said removing said substantially flat surface and before said forming said photoresist layer, forming a silicon anti-reflective coating (Si-ARC) layer on said planarization layer.

15. The method of claim 1, further comprising:
after said removing said substantially flat surface and before said forming said photoresist layer, forming a hardmask layer on said planarization layer.

16. The method of claim 15, further comprising:
after said forming said hardmask layer and before said forming said photoresist layer, forming an anti-reflective coating (ARC) layer on said hardmask layer.

17. The method of claim 15, wherein said hardmask layer comprises LTO.

18. A planarization composition comprising at least one aromatic monomer and at least one non-aromatic monomer, wherein said at least one aromatic monomer has a weight concentration ranging from about 5% to about 35% of the total weight of said planarization composition.

19. The planarization composition of claim 18, wherein said planarization composition having a refractive index (n) in the range from about 1.4 to about 1.8 and an absorption parameter (k) in the range from about 0.2 to about 0.5 at about 193 nm.

20. A planarization composition comprising at least one aromatic monomer and at least one non-aromatic monomer, wherein said at least one non-aromatic monomer has a weight concentration ranging from about 65% to about 95% of the total weight of said planarization composition.

21. The planarization composition of claim 18, wherein said at least one aromatic monomer is selected from the group consisting of 22. A planarization composition comprising at least one aromatic monomer and at least one non-aromatic monomer, wherein said at least one non-aromatic monomer is selected from the group consisting of

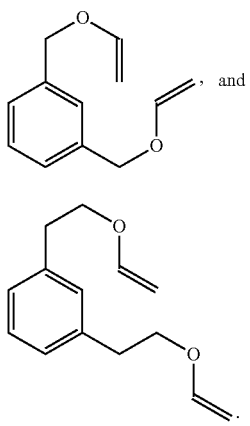

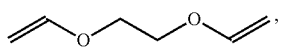

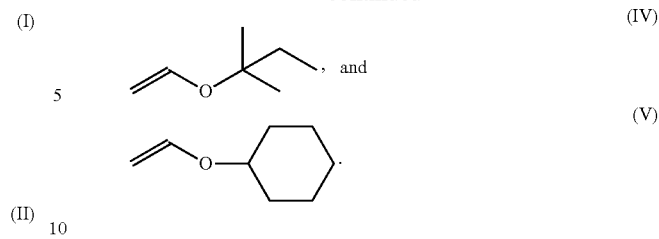

23. The planarization composition of claim 18, wherein said planarization composition further comprises at least one of a photoacid generator, a sensitizing agent, a surfactant, an adhesion agent and a base quencher.

24. The planarization composition of claim 18, wherein said planarization composition comprises a dye which renders said planarization composition a first absorption peak in a wavelength range from about 900 nm to about 1200 nm and a second absorption peak in a wavelength range from about 100 nm to 300 nm.

25. The planarization composition of claim 24, wherein said first absorption peak has an absorption parameter (k) greater than about 0.5 and said second absorption peak has an absorption parameter (k) from about 0.1 to about 0.7.

26. The planarization composition of claim 24, wherein said planarization composition has an absorption parameter (k) less than 0.1 at a wavelength ranging from about 500 nm to about 600 nm.

* * * * *